United States Patent
Isoda et al.

(10) Patent No.: US 9,666,782 B2
(45) Date of Patent: May 30, 2017

(54) P-TYPE SEMICONDUCTOR COMPOSED OF MAGNESIUM, SILICON, TIN, AND GERMANIUM, AND METHOD FOR MANUFACTURING THE SAME

(71) Applicants: NATIONAL INSTITUTE FOR MATERIALS SCIENCE, Tsukuba-shi (JP); MITSUBA CORPORATION, Kiryu-shi, Gunma (JP)

(72) Inventors: Yukihiro Isoda, Tsukuba (JP); Satoki Tada, Kiryu (JP); Hirofumi Fujiu, Kiryu (JP)

(73) Assignees: NATIONAL INSTITUTE FOR MATERIALS SCIENCE, Tsukuba-shi (JP); MITSUBA CORPORATION, Kiryu-shi (JP)

( * ) Notice: Subject to any disclaimer, the term of this patent is extended or adjusted under 35 U.S.C. 154(b) by 0 days.

(21) Appl. No.: 14/900,439

(22) PCT Filed: Jul. 10, 2014

(86) PCT No.: PCT/JP2014/068401
§ 371 (c)(1),
(2) Date: Dec. 21, 2015

(87) PCT Pub. No.: WO2015/012113
PCT Pub. Date: Jan. 29, 2015

(65) Prior Publication Data
US 2016/0149110 A1  May 26, 2016

(30) Foreign Application Priority Data
Jul. 25, 2013  (JP) .................................. 2013-154394

(51) Int. Cl.
*H01L 35/34* (2006.01)
*B22F 3/14* (2006.01)
(Continued)

(52) U.S. Cl.
CPC ................ *H01L 35/34* (2013.01); *B22F 3/14* (2013.01); *C01B 33/06* (2013.01); *C22C 1/04* (2013.01);
(Continued)

(58) Field of Classification Search
CPC ......... H01L 35/34; H01L 35/14; C22C 13/00; C22C 1/04; C22C 23/00; C22C 1/0408; B22F 3/14; B22F 2301/40; C01B 33/06
See application file for complete search history.

(56) References Cited

FOREIGN PATENT DOCUMENTS

| JP | 2008160077 A | 7/2008 |
|----|--------------|--------|
| JP | 2009188368 A | 8/2009 |
| JP | 2010037641 A | 2/2010 |

OTHER PUBLICATIONS

Jan. 26, 2016 International Preliminary Report on Patentability issued in International Application No. PCT/JP2014/068401.
(Continued)

*Primary Examiner* — Kyoung Lee
(74) *Attorney, Agent, or Firm* — Oliff PLC (57) ABSTRACT

A manufacturing method for a p-type semiconductor formed by sintering a compound represented by the general chemical formula: $Mg_2Si_xSn_yGe_z$ (where $X+Y+Z=1$, $X>0$, and $Y>0$, $Z>0$). The p-type semiconductor has a composition in which X is in the range of $0.00<X\leq0.25$, and Z satisfies the relationship: $-1.00X+0.40\geq Z\geq-2.00X+0.10$, where $Z>0.00$, and Y is in the range of $0.60\leq Y\leq0.95$, and Z satisfies either of the relationships: $-1.00Y+1.00\geq Z\geq-1.00Y+0.75$, where $0.60\leq Y\leq0.90$ and $Z>0.00$, and $-2.00Y+1.90\geq Z\geq-1.00Y+0.75$, where $0.90\leq Y\leq0.95$ and $Z>0.00$.

4 Claims, 7 Drawing Sheets

(51) Int. Cl.
*C01B 33/06* (2006.01)
*C22C 23/00* (2006.01)
*H01L 35/14* (2006.01)
*C22C 1/04* (2006.01)
*C22C 13/00* (2006.01)

(52) U.S. Cl.
CPC .............. *C22C 13/00* (2013.01); *C22C 23/00* (2013.01); *H01L 35/14* (2013.01); *B22F 2301/40* (2013.01); *C22C 1/0408* (2013.01)

(56) References Cited

OTHER PUBLICATIONS

Jiang et al., Improving p-type thermoelectric performance of Mg2(Ge,Sn) compounds via solid solution and Ag doping, Intermetallics, Jan. 2013, vol. 32, pp. 312-317.

Khan et al., "High thermoelectric figure of merit of Mg2Si0.55Sn0.4Ge0.05 materials doped with Bi and Sb," Scripta Materialia, Jul. 16, 2013, vol. 69, No. 8, pp. 606-609.

Oct. 14, 2014 Internation Search Report issued in International Application No. PCT/JP2014/068401.

Fedorov et al., "Transport Properties of Mg2X0.4Sn0.6 Solid Solutions (X=Si, Ge) with p-Type Conductivity," Physics of the Solid State, 2006, vol. 48, No. 8, pp. 1486-1490.

Tada et al., "Preparation and thermoelectric properties of Mg2Si0.9-XSnXGe0.1," Phys. Status Solidi C 10, No. 12, Nov. 13, 2013, pp. 1704-1707.

Ihou-Mouko et al., "Thermoelectric properties and electronic structure of p-type Mg2Si and Mg2Si0.6Ge0.4 compounds doped with Ga," Journal of Alloys and Compounds, vol. 509, 2011, pp. 6503-6508.

Akasaka et al., "The thermoelectric properties of bulk crystalline n- and p-type Mg2Si prepared by the vertical Bridgman method," Journal of Applied Physics, vol. 104, 2008, pp. 013703-1-013703-8.

| Mg composition | Si composition (X) | Sn composition (Y) | Ge composition (Z) |
|---|---|---|---|
| 2.00 | 0.25 | 0.70 | 0.05 |
| 2.00 | 0.25 | 0.65 | 0.10 |
| 2.00 | 0.25 | 0.60 | 0.15 |
| 2.00 | — | 0.90 | 0.10 |
| 2.00 | — | 0.75 | 0.25 |
| 2.00 | — | 0.60 | 0.40 |

Fig. 2B

| Mg composition | Si composition (X) | Sn composition (Y) | Ge composition (Z) |
|---|---|---|---|
| 1.99 | 0.25 | 0.70 | 0.05 |
| 2.01 | 0.25 | 0.66 | 0.09 |
| 2.00 | 0.26 | 0.60 | 0.14 |
| 2.00 | — | 0.90 | 0.10 |
| 2.00 | — | 0.76 | 0.24 |
| 2.00 | — | 0.61 | 0.39 |

| Mg composition | Si composition x | Sn composition y | Ge composition z | Conduction type | Seebeck coefficient (µV/K) | Thermal conductivity (W/mK) | Resistivity (Ωm) |
|---|---|---|---|---|---|---|---|
| 2.00 | 0.30 | 0.55 | 0.15 | n | -550.9 | 2.12 | 3.52×10⁻³ |
| 2.00 | 0.25 | 0.55 | 0.20 | n | -429.1 | 2.22 | 1.75×10⁻² |
| 2.00 | 0.00 | 0.55 | 0.45 | n | -571.4 | 2.91 | 1.07×10⁻² |
| 2.00 | 0.30 | 0.60 | 0.10 | n | -543.6 | 2.17 | 1.37×10⁻² |
| 2.00 | 0.25 | 0.60 | 0.15 | p | 422.4 | 2.21 | 1.48×10⁻² |
| 2.00 | 0.00 | 0.60 | 0.40 | p | 227.7 | 2.95 | 1.79×10⁻² |
| 2.00 | 0.25 | 0.65 | 0.10 | p | 492.0 | 2.23 | 8.72×10⁻³ |
| 2.00 | 0.15 | 0.65 | 0.20 | p | 289.3 | 2.42 | 9.29×10⁻³ |
| 1.98 | 0.30 | 0.70 | 0.00 | n | -210.6 | 2.29 | 1.13×10⁻² |
| 2.00 | 0.25 | 0.70 | 0.05 | p | 473.8 | 2.27 | 4.39×10⁻³ |
| 2.00 | 0.25 | 0.75 | 0.00 | p | 472.3 | 2.39 | 5.27×10⁻³ |
| 2.00 | 0.15 | 0.75 | 0.10 | p | 434.5 | 2.62 | 4.35×10⁻³ |
| 2.00 | 0.10 | 0.75 | 0.15 | p | 494.0 | 2.70 | 1.98×10⁻³ |
| 2.00 | 0.00 | 0.75 | 0.25 | p | 402.2 | 3.18 | 2.57×10⁻³ |
| 1.98 | 0.20 | 0.80 | 0.00 | p | 442.0 | 2.54 | 3.52×10⁻³ |
| 1.98 | 0.15 | 0.85 | 0.00 | p | 362.2 | 2.85 | 2.01×10⁻³ |
| 1.98 | 0.10 | 0.90 | 0.00 | p | 295.4 | 3.30 | 1.00×10⁻³ |
| 2.00 | 0.00 | 0.90 | 0.10 | p | 85.8 | 4.15 | 1.34×10⁻³ |
| 2.00 | 0.05 | 0.95 | 0.00 | p | 113.5 | 4.21 | 6.39×10⁻⁴ |
| 2.00 | 0.00 | 0.95 | 0.05 | n | -27.8 | 4.91 | 5.03×10⁻⁴ |
| 2.00 | 0.00 | 1.00 | 0.00 | n | -23.8 | 6.58 | 2.80×10⁻⁴ |

P-TYPE SEMICONDUCTOR COMPOSED OF MAGNESIUM, SILICON, TIN, AND GERMANIUM, AND METHOD FOR MANUFACTURING THE SAME

BACKGROUND

The present disclosure relates to a p-type semiconductor composed of magnesium, silicon, tin, and germanium, and a method for manufacturing the same.

Recently, attempts have been made to improve thermoelectric performance by reducing the resistivity by carrier concentration control by doping a $Mg_2Si$-based material with a p-type dopant (for example, Ag, Ga, or Li). Examples of such materials include:

$Mg_2Si+1$ at % Ag, $ZT=0.1$ (560 K): (See M. Akasaka et al., *J. Appl. Phys.*, 104, 013703, 2008).

$Mg_2Si_{0.6}Ge_{0.4}+0.8\%$ Ga, $ZT=0.36$ (625 K): (see H. Lhou-Mouko et al., *J. Alloys Compd.*, 509, pp. 6503-6508, 2011).

$Mg_2Si_{0.25}Sn_{0.75}+Ag$-20000 ppm and Li-5000 ppm, $ZT=0.32$ (600 K): (see Japanese Published Unexamined Patent Application No. 2010-37641).

SUMMARY $Mg_2(SiSn)$ and $Mg_2(SiGe)$ have been studied as promising p-type semiconductors, however, there are no known attempts that have been developed into semiconductors on a practical level. P-type semiconductors $Mg_2(SiSn)$ and $Mg_2(SiGe)$ are solid solutions with $Mg_2Si$, and it is believed that Ge and Sn contribute to p-type conduction in the solid solutions. Therefore, elements that can change the Si site of the base composition must form an anti-fluorite structure with Mg. Such metal elements are limited to silicon (Si), germanium (Ge), tin (Sn), and lead (Pb) of Group 14. However, Pb is generally excluded from this list of elements because it is a hazardous metal.

An attempt was made to improve the performance of a p-type thermoelectric semiconductor by using the following quaternary system:

$Mg_2Si_XSn_YGe_Z$, where $X+Y+Z=1$ and $X>0$, $Y>0$, $Z>0$.

When using ternary $Mg_2SiSn$, only two phase diagrams of $Mg_2Si$ and $Mg_2Sn$ are considered. However, when using the above-mentioned quaternary system, four phase diagrams of $Mg_2Ge$, $Mg_2(SiSn)$, $Mg_2(SiGe)$, and $Mg_2(SnGe)$ must be considered. As a result, preparation of a single-phase sample of the quaternary system is difficult. These are problems that the present disclosure is intended to solve.

In view of the circumstances described above, the present disclosure addresses the above-described problems. One embodiment according to the present disclosure provides a method for manufacturing a p-type semiconductor composed of magnesium, silicon, tin, and germanium. The method of manufacturing the p-type semiconductor involves sintering a compound represented by the following general chemical formula:

$Mg_2Si_XSn_YGe_Z$, where $X+Y+Z=1$ and $X>0$, $Y>0$, $Z>0$ and is obtained through liquid-solid reaction of magnesium, silicon, tin, and germanium as raw materials. The obtained semiconductor is a p-type semiconductor satisfying the following equations:

X is in the range of $0.00<X\leq0.25$, and Z satisfies the relationship of $-1.00X+0.40\geq Z\geq-2.00X+0.10$, where $Z>0.00$, and Y is in the range of $0.60\leq Y\leq0.95$, and Z satisfies either of the following relationships:

$-1.00Y+1.00\geq Z\geq-1.00Y+0.75$, when $0.60\leq Y\leq0.90$ and $Z>0.00$, and $-2.00Y+1.90\geq Z\geq-1.00Y+0.75$, when $0.90\leq Y\leq0.95$ and $Z>0.00$.

Another embodiment according to the present disclosure provides a p-type semiconductor composed of magnesium, silicon, tin, and germanium. The p-type semiconductor is manufactured by sintering a material represented by the following general chemical formula:

$Mg_2Si_XSn_YGe_Z$, where $X+Y+Z=1$ and $X>0$, $Y>0$, $Z>0$ obtained through liquid-solid reaction of magnesium, silicon, tin, and germanium as raw materials.

The obtained semiconductor is a p-type semiconductor satisfying the following equations:

X is in the range of $0.00<X\leq0.25$, and Z satisfies the relationship:

$-1.00X+0.40\geq Z\geq-2.00X+0.10$, where $Z>0.00$, and

Y is in the range of $0.60\leq Y\leq0.95$, and Z satisfies either of the following relationships:

$-1.00Y+1.00\geq Z\geq-1.00Y+0.75$, when $0.60\leq Y\leq0.90$ and $Z>0.00$, and $-2.00Y+1.90\geq Z\geq-1.00Y+0.75$, when $0.90\leq Y\leq0.95$ and $Z>0.00$.

The above embodiments make it possible to easily manufacture a p-type semiconductor represented by the following general chemical formula:

$Mg_2Si_XSn_YGe_Z$, where $X+Y+Z=1$ and $X>0$, $Y>0$, $Z>0$.

DETAILED DESCRIPTION OF THE EMBODIMENTS

The present disclosure provides a p-type semiconductor made of a sintered compact of an intermetallic compound of magnesium (Mg), silicon (Si), tin (Sn), and germanium (Ge), which is represented by the following general chemical formula:

$Mg_2Si_XSn_YGe_Z$, wherein $X+Y+Z=1$ and $X>0$, $Y>0$, $Z>0$. The sintered compact of the intermetallic compound is manufactured as follows.

Granular Mg and Sn with a grain size of approximately 2 to 10 mm are prepared, and powdery Si and Ge with a grain size of approximately several tens of μm are prepared.

Predetermined amounts of these materials are weighed and put into a carbon board. The carbon board is covered with a carbon lid, and heated for 4 hours at an absolute temperature of 1173 K under an atmosphere of 0.1 MPa ArH$_2$ (3 weight % hydrogen) to cause a liquid-solid reaction.

The obtained solid solution is pulverized into powder with a grain size of 38 to 75 µm, and sintered by hot-pressing. The sintering pressure is standardized to 50 MPa and the sintering time is standardized to 1 hour. The sintering temperature was determined according to each Sn composition amount Y. The sintering temperature is set to 1190 K when Y=0, 1040 K when Y=0.60 or 0.65, and 930 K when Y=0.75 or 0.90.

Figure 1:
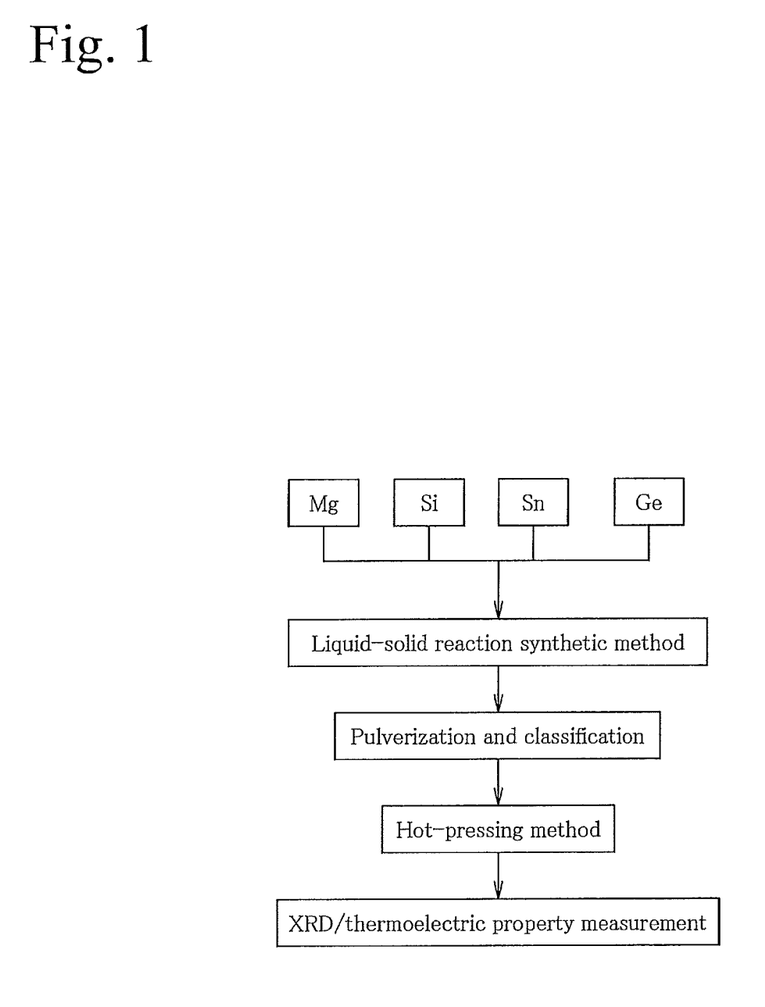
FIG. 1 is a process chart for obtaining a p-type semiconductor according to an embodiment of the present disclosure.
Figure 2A:
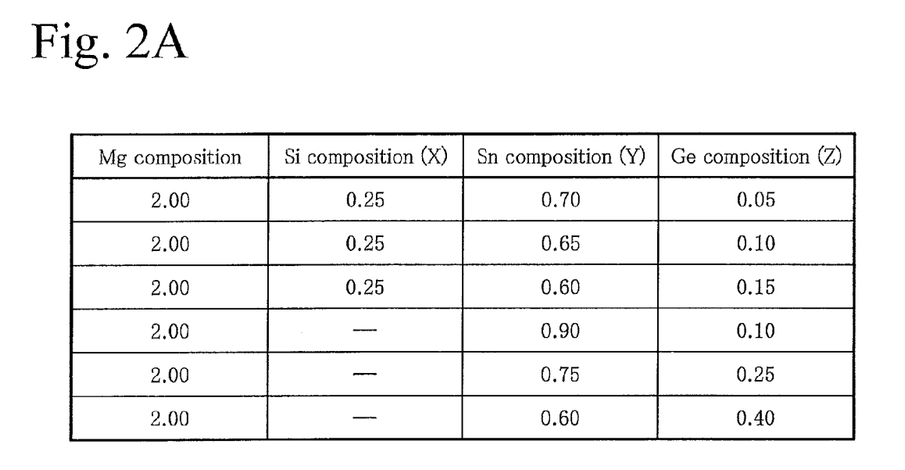
FIG. 2A is a table showing compositions of weighed values of p-type semiconductors.
Figure 2B:
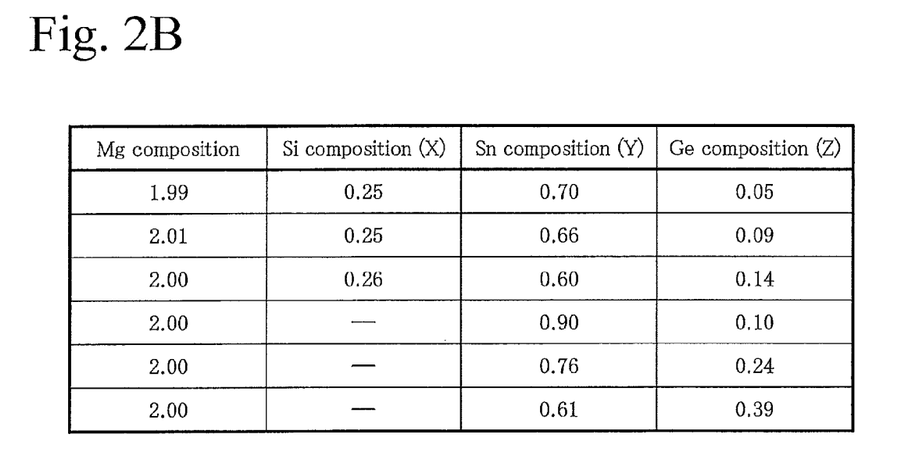
FIG. 2B is a table showing compositions of p-type semiconductors according to the present disclosure.

Weighed values (mole ratios) and compositions (mole ratios) of several sintered compacts obtained as described above are shown in the tables of FIG. 2. According to this, the weighed values (FIG. 2A) and the compositions (FIG. 2B) of the sintered compacts are found to have changed little when comparing the amounts of the Mg, Si, Sn and Ge before and after sintering.

Figure 3:
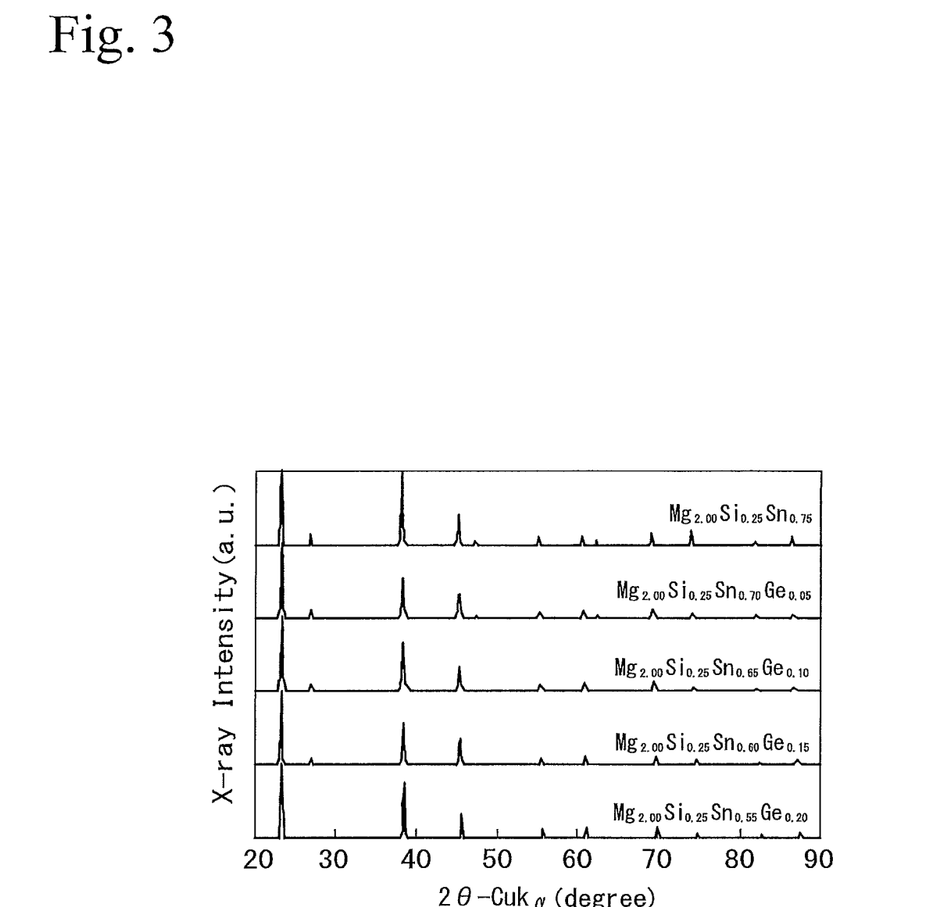
FIG. 3 is a graph showing X-ray diffraction measurement results of $Mg_2Si_{0.25}Sn_YGe_Z$ in various p-type semiconductors.

Further, in FIG. 3, results of X-ray diffraction measurement of Mg$_2$Si$_{0.25}$Sn$_Y$Ge$_Z$ obtained as described above are shown. According to X-ray diffraction, peaks were observed with all of the sintered compacts existing between Mg$_2$Si and Mg$_2$Sn having an anti-fluorite structure. Only peaks caused by the anti-fluorite structure were observed, and no peaks were observed with oxides, Mg$_2$Si, Mg$_2$Ge, and Mg$_2$Sn. Based on the data in FIG. 3, it was confirmed that all of the sintered compacts were single-phase. The same results were obtained with other sintered compacts.

Figure 4:
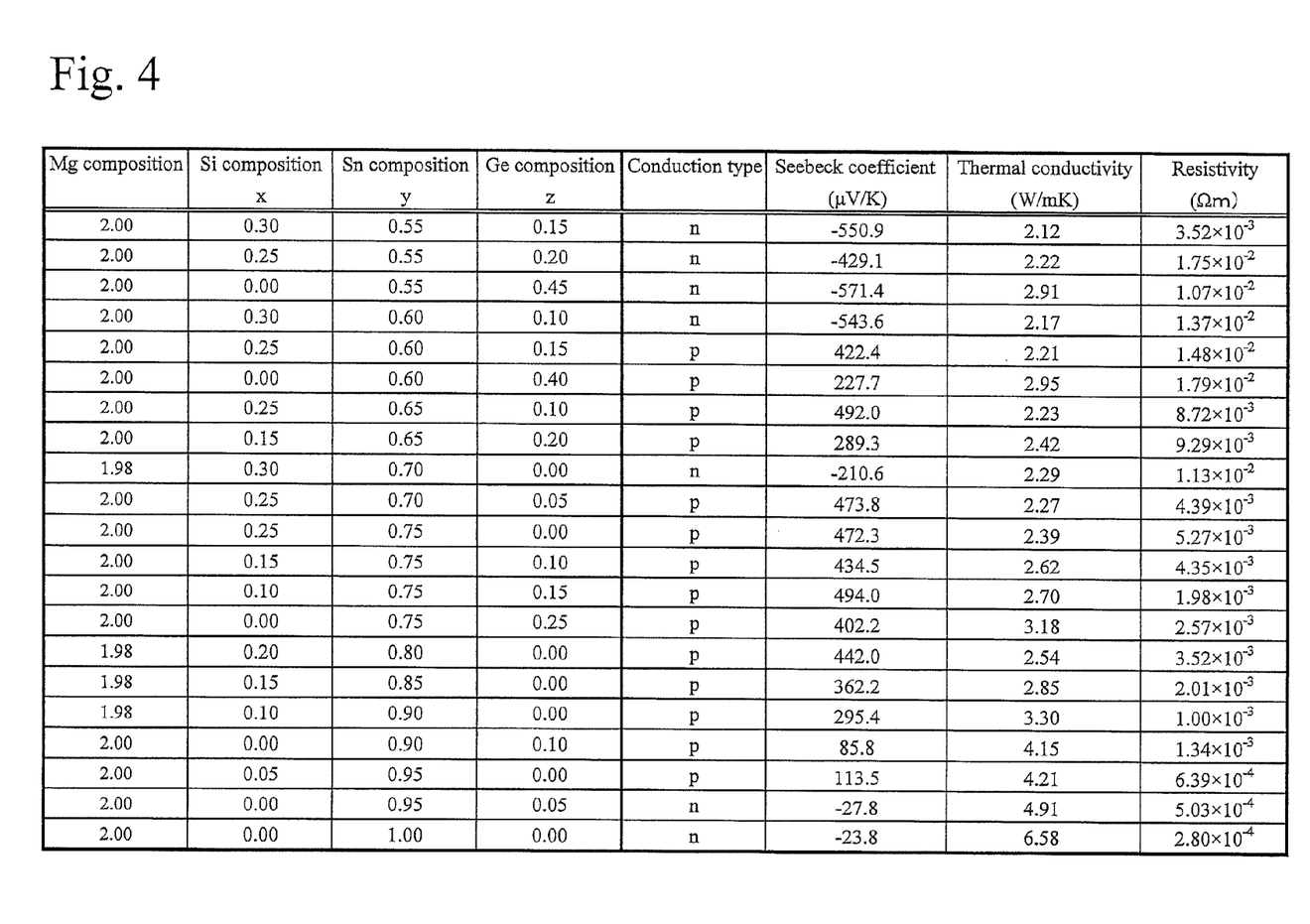
FIG. 4 is a table showing the compositions (weighed values) of $Mg_2Si_XSn_YGe_Z$ and thermoelectric properties thereof at a room temperature in various p-type semiconductors.
Figure 5A:
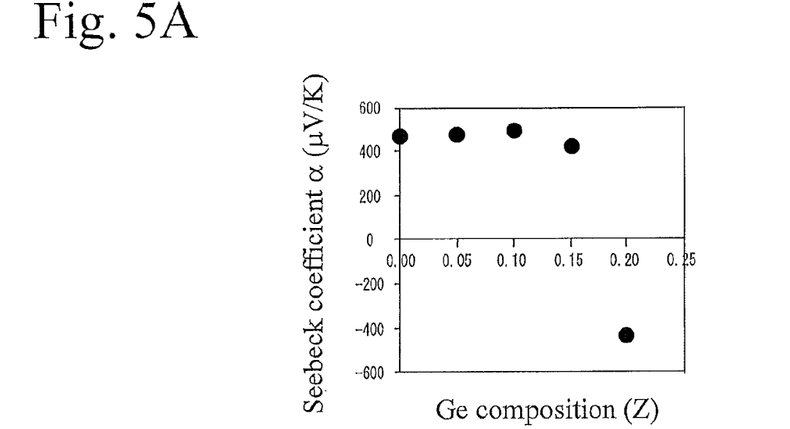
FIG. 5A, FIG. 5B, and FIG. 5C are graphs showing the relationships between the Ge composition and the Seebeck coefficient α, the thermal conductivity κ, and the resistivity ρ in various p-type semiconductors.
Figure 5B:
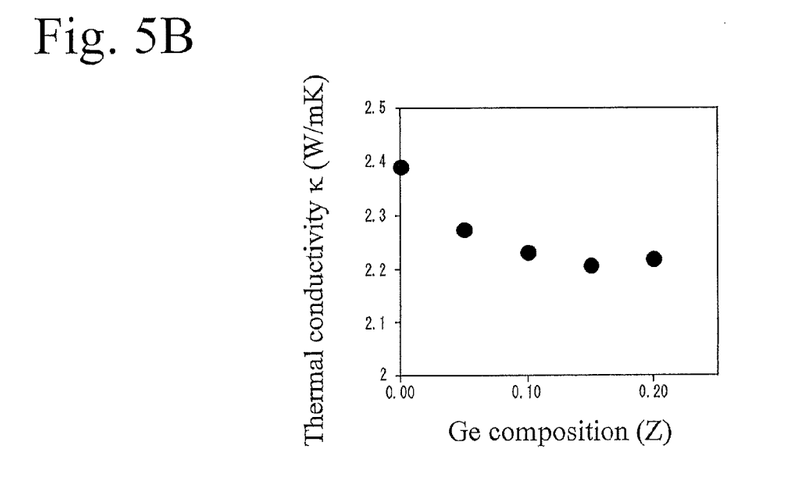
Figure 5C:
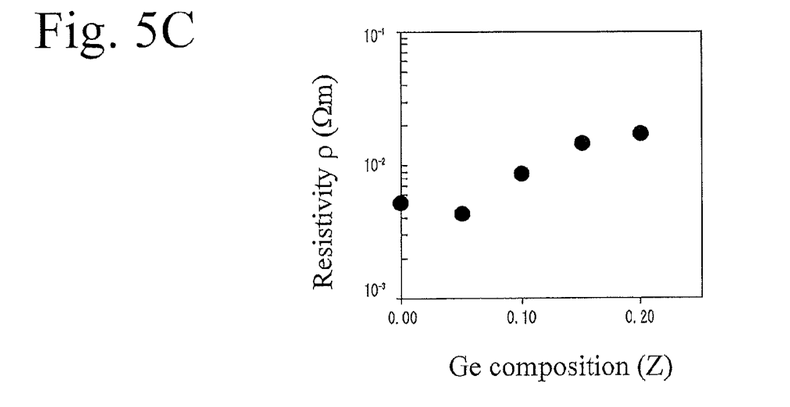

Next, the conduction types, the Seebeck coefficients α (µV/K), the thermal conductivities κ (W/mK), and the resistivities ρ (Ωm) of various sintered compacts of Mg$_2$Si$_X$Sn$_Y$Ge$_Z$ thus obtained are shown in the table of FIG. 4. In FIG. 5, graphs showing the relationships between the Ge composition and the Seebeck coefficient α, the thermal conductivity κ, and the resistivity ρ are shown.

Figure 6:
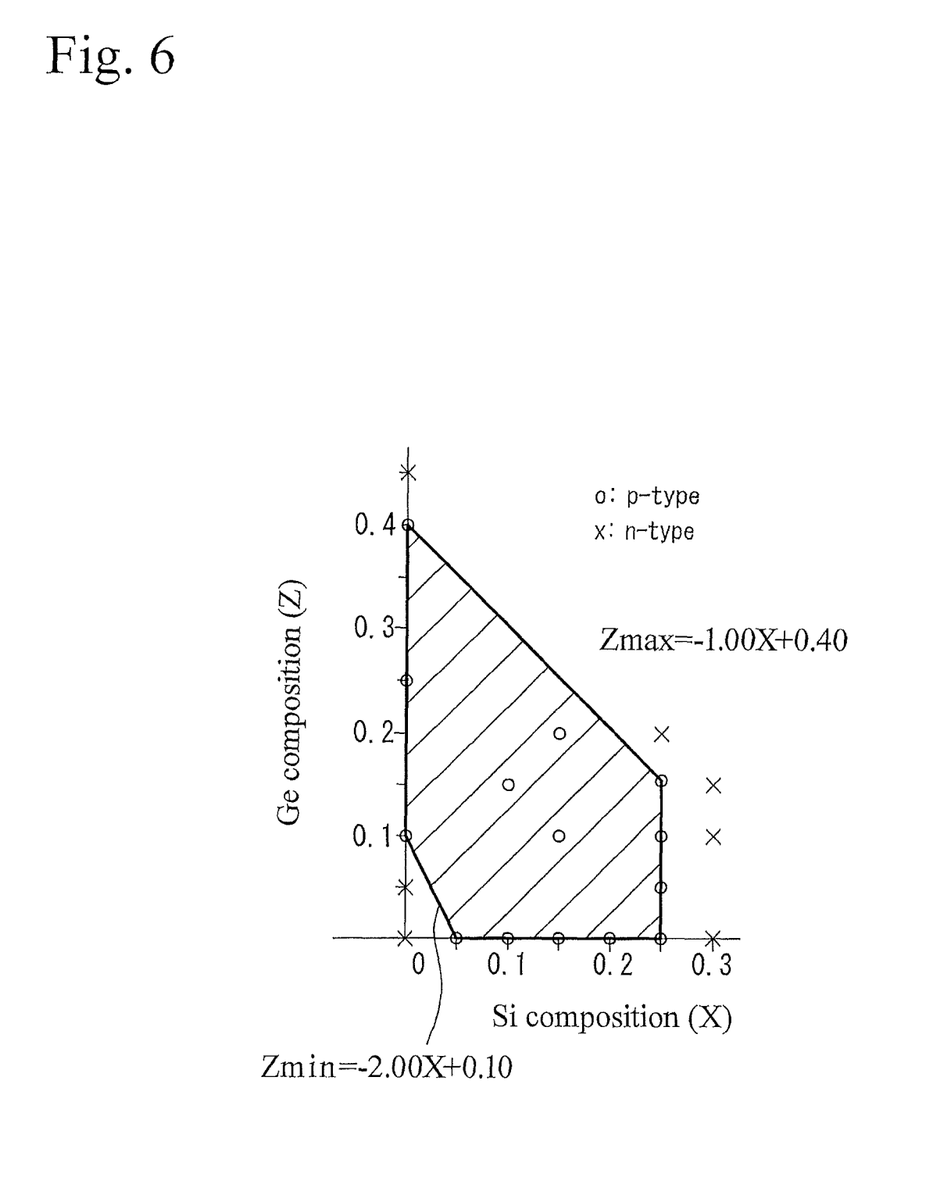
FIG. 6 is a graph showing the relationship between X and Z in various p-type semiconductors.

Next, conduction types of semiconductors with variable values for X and Z based on the results of FIG. 4 are plotted in FIG. 6. Conduction types of these semiconductors in which the values between Y and Z change are plotted in FIG. 7. From these graphs, the conduction type border between the p-type and the n-type is found to have changed linearly. In each graph, ○ indicates p-type, and x indicates n-type.

First, observing the relationship between X and Z in FIG. 6, as a p-type semiconductor, X is in the range of 0.00<X≤0.25. When X is in this range, a maximum value $Z_{max}$ and a minimum value $Z_{min}$ of Z for obtaining a p-type semiconductor change linearly in relation to X. A linear function of $Z_{max}$ and a linear function of $Z_{min}$ are respectively obtained as follows:

$Z_{max}$=−1.00X+0.40

$Z_{min}$=−2.00X+0.10, where $Z_{min}$>0.00.

It is confirmed that, as a p-type semiconductor, X and Z fall within the shaded range shown in FIG. 6, that is, X and Z satisfy the following relationship:

−1.00X+0.40≥Z≥−2.00X+0.10, where Z>0.00.

Figure 7:
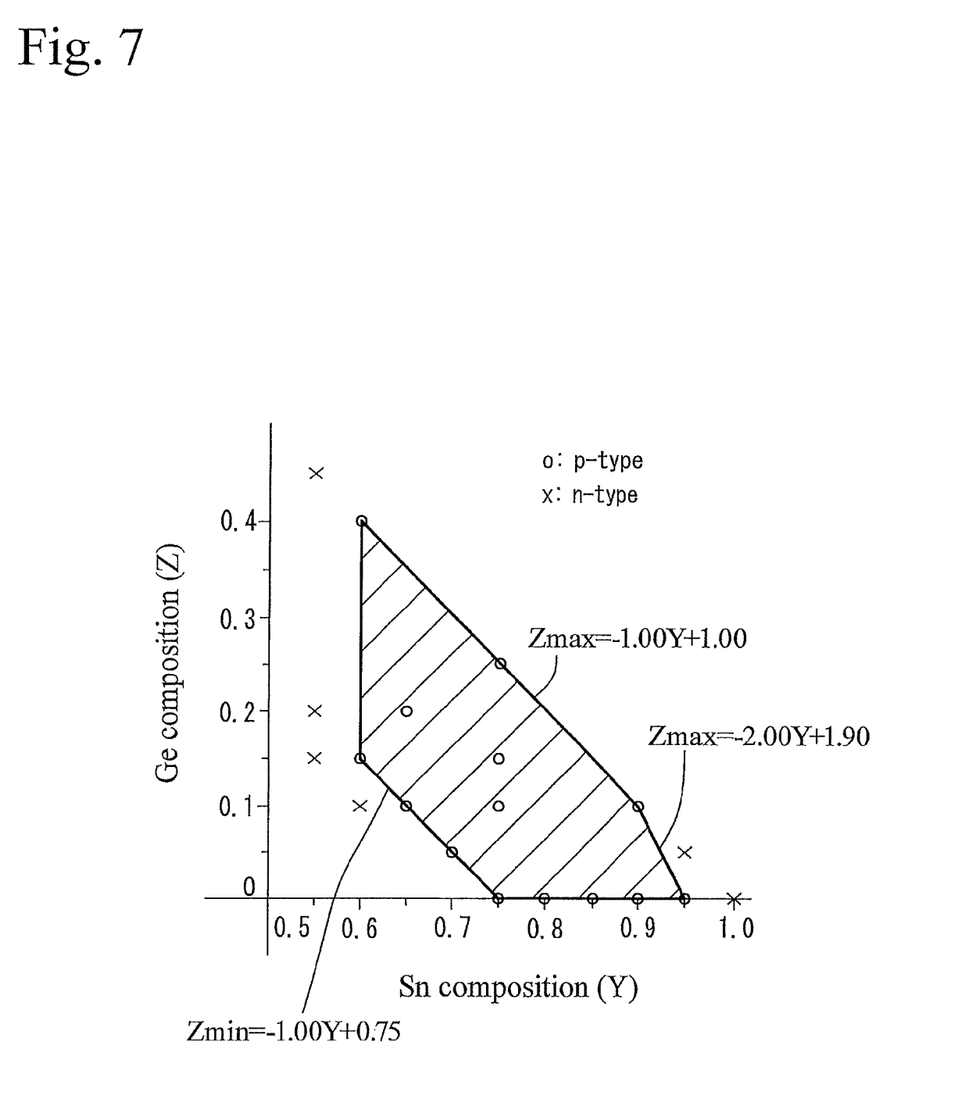
FIG. 7 is a graph showing the relationship between Y and Z in various p-type semiconductors.

Observing the relationship between Y and Z in FIG. 7, as a p-type semiconductor, Y is in the range of 0.60≤Y≤0.95. When Y is in this range, a maximum value $Z_{max}$ and a minimum value $Z_{min}$ of Z for obtaining a p-type semiconductor change linearly in relation to Y, and a linear function of $Z_{max}$ and a linear function of $Z_{min}$ are obtained as follows:

$Z_{max}$=−1.00Y+1.00, where 0.60≤Y≤0.90

$Z_{max}$=−2.00Y+1.90, where 0.90≤Y≤0.95

$Z_{min}$=−1.00Y+0.75, where $Z_{min}$>0.00.

It is confirmed that as a p-type semiconductor, Y and Z fall within the shaded range shown in FIG. 7, that is, Y and Z satisfy the following relationship:

−1.00Y+1.00≥Z≥−1.00Y+0.75, where 0.60≤Y≤0.90 and Z>0.00, or

−2.00Y+1.90≥Z≥−1.00Y+0.75, where 0.90≤Y≤0.95 and Z>0.00.

The present disclosure is applicable to obtaining of a p-type semiconductor composed of Mg$_2$Si$_X$Sn$_Y$Ge$_Z$.

The invention claimed is:

1. A method for manufacturing a p-type semiconductor composed of magnesium, silicon, tin, and germanium comprising:
   mixing magnesium, silicon, tin, and germanium as raw materials,
   obtaining, by liquid-solid reaction, a solid solution of the magnesium, silicon, tin, and germanium mixture represented by the following general chemical formula:
   Mg$_2$Si$_X$Sn$_Y$Ge$_Z$, where X+Y+Z=1 and X>0, Y>0, Z>0, and
   sintering the obtained mixture to produce a p-type semiconductor, the p-type semiconductor represented by the following general chemical formula:
   Mg$_2$Si$_X$Sn$_Y$Ge$_Z$, wherein:
   X is in the range of 0.00<X≤0.25, and Z satisfies the relationship of −1.00X+0.40≥Z≥−2.00X+0.10, and Z>0.00, and
   Y is in the range of 0.60≤Y≤0.95, and Z satisfies either of the following relationships:
   −1.00Y+1.00≥Z≥−1.00Y+0.75, where 0.60≤Y≤0.90 and Z>0.00, and
   −2.00Y+1.90≥Z≥−1.00Y+0.75, where 0.90≤Y≤0.95 and Z>0.00.

2. The method according to claim 1, wherein Y is in the range of 0.65≤Y≤0.90.

3. A p-type semiconductor composed of magnesium, silicon, tin, and germanium, wherein:
   the p-type semiconductor is manufactured by a liquid-solid reaction of magnesium, silicon, tin, and germanium as raw materials to obtain a material represented by the following general chemical formula:
   Mg$_2$Si$_X$Sn$_Y$Ge$_Z$, where X+Y+Z=1 and X>0, Y>0, Z>0, followed by sintering to obtain a the p-type semiconductor, the p-type semiconductor represented by the following general chemical formula:
   Mg$_2$Si$_X$Sn$_Y$Ge$_Z$, where:
   X is in the range of 0.00<X≤0.25, and Z satisfies the relationship:
   −1.00X+0.40≥Z≥−2.00X+0.10, where Z>0.00, and
   Y is in the range of 0.60≤Y≤0.95, and Z satisfies either of the following relationships:
   −1.00Y+1.00≥Z≥−1.00Y+0.75, where 0.60≤Y≤0.90 and Z>0.00, and
   −2.00Y+1.90≥Z≥−1.00Y+0.75, where 0.90≤Y≤0.95 and Z>0.00.

4. The p-type semiconductor of claim 3, wherein Y is in the range of 0.65≤Y≤0.90.

* * * * *